United States Patent
Bobick

(10) Patent No.: US 11,681,003 B1
(45) Date of Patent: Jun. 20, 2023

(54) GENERATING SIMULATED WAVEFORMS FOR AN ELECTRIC METER WHEN OPERATING IN A SIMULATION MODE

(71) Applicant: Landis+Gyr Innovations, Inc., Alpharetta, GA (US)

(72) Inventor: David A. Bobick, West Lafayette, IN (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 2 days.

(21) Appl. No.: 17/549,522

(22) Filed: Dec. 13, 2021

(51) Int. Cl.
  *G01R 35/04* (2006.01)
  *G01R 22/06* (2006.01)

(52) U.S. Cl.
  CPC ........... *G01R 35/04* (2013.01); *G01R 22/061* (2013.01)

(58) Field of Classification Search
  CPC .. G01R 31/088; G01R 33/54; G01R 31/3842; G01R 33/5608; G01R 19/25; G01R 21/06; G01R 21/133; G01R 35/00; G01R 35/005; G01R 13/0272; G01R 1/28; G01R 19/16528; G01R 31/31708; G01R 31/318307; G01R 31/318357; G06F 9/455; G06F 30/33; G06F 30/367; G06F 7/57; G06F 9/3001; G06F 8/443; H04L 25/0204
  See application file for complete search history.

(56) References Cited

U.S. PATENT DOCUMENTS

| | | | | |
|---|---|---|---|---|
| 6,711,509 B2 * | 3/2004 | Bilas | ...................... | G01R 35/04 702/61 |
| 6,815,942 B2 * | 11/2004 | Randall | .................. | G01R 35/04 324/74 |
| 6,879,949 B2 * | 4/2005 | Scherr | ................... | G06F 30/367 703/2 |
| 7,513,683 B2 * | 4/2009 | Sanderford | ............ | G01R 31/66 374/102 |
| 9,506,950 B2 * | 11/2016 | Ramirez | ................ | G06Q 50/06 |
| 10,033,400 B1 * | 7/2018 | Mallett | ............... | H03M 1/1071 |
| 10,393,791 B2 * | 8/2019 | Minich | .................. | G01R 31/68 |

* cited by examiner

*Primary Examiner* — Vinh P Nguyen

(74) *Attorney, Agent, or Firm* — Kilpatrick Townsend & Stockton LLP

(57) ABSTRACT

Techniques for generating simulated waveforms for an electric meter include operating a meter in simulation mode without an external load device connected to the meter. Simulated waveforms are generated for a number of channels based on waveform component values. The waveforms are generated at a rate that corresponds to a sample rate of an analog to digital converter (ADC) of the meter. In simulation mode, the waveforms are provided to a meter firmware interface, instead of the waveform data obtained from the ADC.

20 Claims, 5 Drawing Sheets

GENERATING SIMULATED WAVEFORMS FOR AN ELECTRIC METER WHEN OPERATING IN A SIMULATION MODE

TECHNICAL FIELD

Implementations described herein relate to electric meters and, more particularly, to generating simulated waveforms for an electric meter.

BACKGROUND

Electric meters measure and monitor electric energy. In normal operating mode, a meter is connected to an electric distribution network and to a premises. The meter receives power signals from the electric distribution network that are complex, i.e., they include harmonics, offsets, phase shifts, and other variations, and processes the signals. In order to develop, test, or validate meter functions, a meter is typically put into a simulation environment in which the meter may be connected to an external load box. The load box simulates the complex power signals that may be received by a meter when it is connected to the electric distribution network. Such load boxes are typically bulky and expensive. In addition, many load boxes are limited to providing signals for a single meter form.

SUMMARY

Some implementations described herein include a method for generating simulated waveforms by an electric meter. The method includes operating in a simulation mode. No external load device is required to be connected to an analog to digital converter (ADC) within the meter while operating in the simulation mode. The method includes generating simulated waveforms for a number of channels using waveform component values provided by a simulation interface component. The waveform component values for a channel include at least a voltage or a current value, a frequency value, and a phase value. The operations include generating a simulated channel waveform using the set of waveform component values for a channel at a rate that corresponds to a sampling rate of the ADC. The sampling rate of the ADC in simulation mode matches the sampling rate of the ADC in normal operating mode. The method further includes providing the simulated channel waveforms for the channels to a meter firmware interface. The meter firmware interface receives waveform data obtained from the ADC during normal operating mode.

In some implementations, the meter firmware includes a waveform simulator, an event generator, and the meter firmware interface. The waveform simulator is configured to generate waveforms using the waveform components. The external simulation interface component may be connected to the meter and may provide waveform component values to the meter firmware, specifically to the waveform simulator and to the event generator. Waveform component values may be provided for different meter forms in order to generate simulated waveforms for multiple meter forms.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

Conventionally, an external load box is required when testing and validating electric meter functions and when developing new functions and capabilities. The external load box may include specialized hardware for providing electrical signals to the electric meter. Since the external load box may be relatively large and expensive, requiring a load box may limit testing and validation since it may be difficult to obtain or access a load box. Furthermore, the external load box may have limited testing capabilities. For example, the external load box may only provide signals for a single phase, so that multiple load boxes or multiple configurations of a single load box may be required to test different meter forms.

To address these issues, the disclosed invention provides a waveform simulator and an event generator in the meter firmware. The waveform simulator generates simulated waveforms for a number of channels. For a single phase meter, the waveform simulator generates simulated waveforms for two channels, phase A voltage and phase A current. For a three-phase meter, the waveform simulator generates simulated waveforms for six channels, phase A voltage, phase A current, phase B voltage, phase B current, phase C voltage and phase C current.

The meter can generate the simulated waveforms when the meter is operating in a simulation mode. While in the simulation mode, the waveform simulator can download waveform component values from an external component or tool and use the waveform component values to generate the simulated waveforms. The waveform simulator may generate the simulated waveforms at a rate that corresponds to a sampling rate of the analog to digital converter (ADC). The sampling rate of the ADC in simulation mode may be the same as a sample rate of the ADC in a normal operating mode.

Additionally, the meter firmware can include an event generator that can download event component values from the external component. The event generator can use the event component values to generate exemplary events, such as sag events or swell events, to be incorporated into the simulated waveforms.

The waveform simulator may provide the simulated waveforms, which may include any simulated events, to a meter firmware interface. In a normal operating mode, the meter firmware interface receives waveforms obtained from the ADC. Since the simulated waveforms are provided to the meter firmware interface and the meter firmware interface is located at a front end of the meter firmware, the meter firmware may be comprehensively tested using the simulated waveforms.

Figure 1:
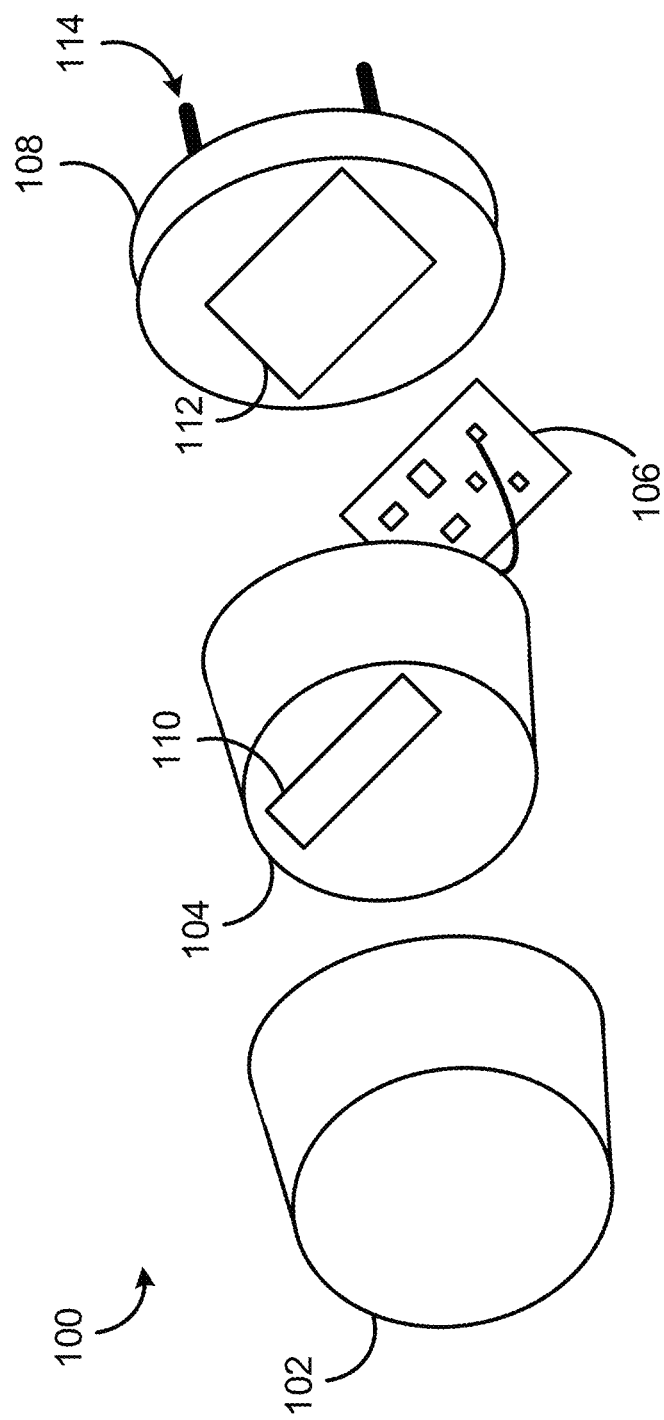
FIG. 1 is an exploded perspective diagram of an exemplary electric meter configured to generate simulated waveforms, according to some implementations described herein.

FIG. 1 is an exploded perspective diagram of an exemplary electric meter 100 that may be configured to generate simulated waveforms, according to some implementations described herein. In some implementations, the electric meter 100, also referred to as a meter 100, measures consumption of electricity and power characteristics. The meter 100 includes a meter housing 102, an interior cover 104, a circuit board 106, and a meter base 108. The meter housing 102 is a cylindrical open bottom structure that can be positioned on top of the interior cover 104. In some examples, the meter housing 102 can be at least partially transparent for viewing a display provided on the interior cover 104 beneath the meter housing 102 when the meter 100 is assembled.

The interior cover 104 also has a cylindrical open bottom structure. The interior cover 104 can fit within the meter housing 102 and can be attached to the meter base 108. The interior cover 104 may include a display 110 or other user interface that provides information, such as consumption data determined by the meter, that may be visible through the transparent meter housing 102. The circuit board 106 is included within an interior of the interior cover 104. The circuit board 106 may include components used to measure energy consumption, to communicate with the user interface, and to communicate on a network. The meter base 108 includes a main plate 112, prongs 114, and measurement circuitry (not shown). The circuit board 106 can be secured to the main plate 112. The prongs 114 may extend from the back of the meter base 108 and may be used to mount the meter 100 into a meter socket. The measurement circuitry may measure current and/or voltage from power lines connected to the meter 100 when the meter is mounted to the socket and the socket is connected to a power distribution network.

When the meter 100 is fully assembled (e.g., meter housing 102 and interior cover 104 attached to the meter base 108) and mounted into a socket at a premises, the meter 100 may operate in a normal operating mode and measure energy consumption. An ADC on the circuit board 106 may sample signals provided by the measurement circuitry. Typically, the ADC provides multiple channels of data, e.g., a voltage channel and a current channel per phase. Components on the circuit board 106 may perform further processing to determine power and/or consumption measurements. Although one type of meter is depicted in FIG. 1, the waveform simulator may be used with other types of meters.

Figure 2:
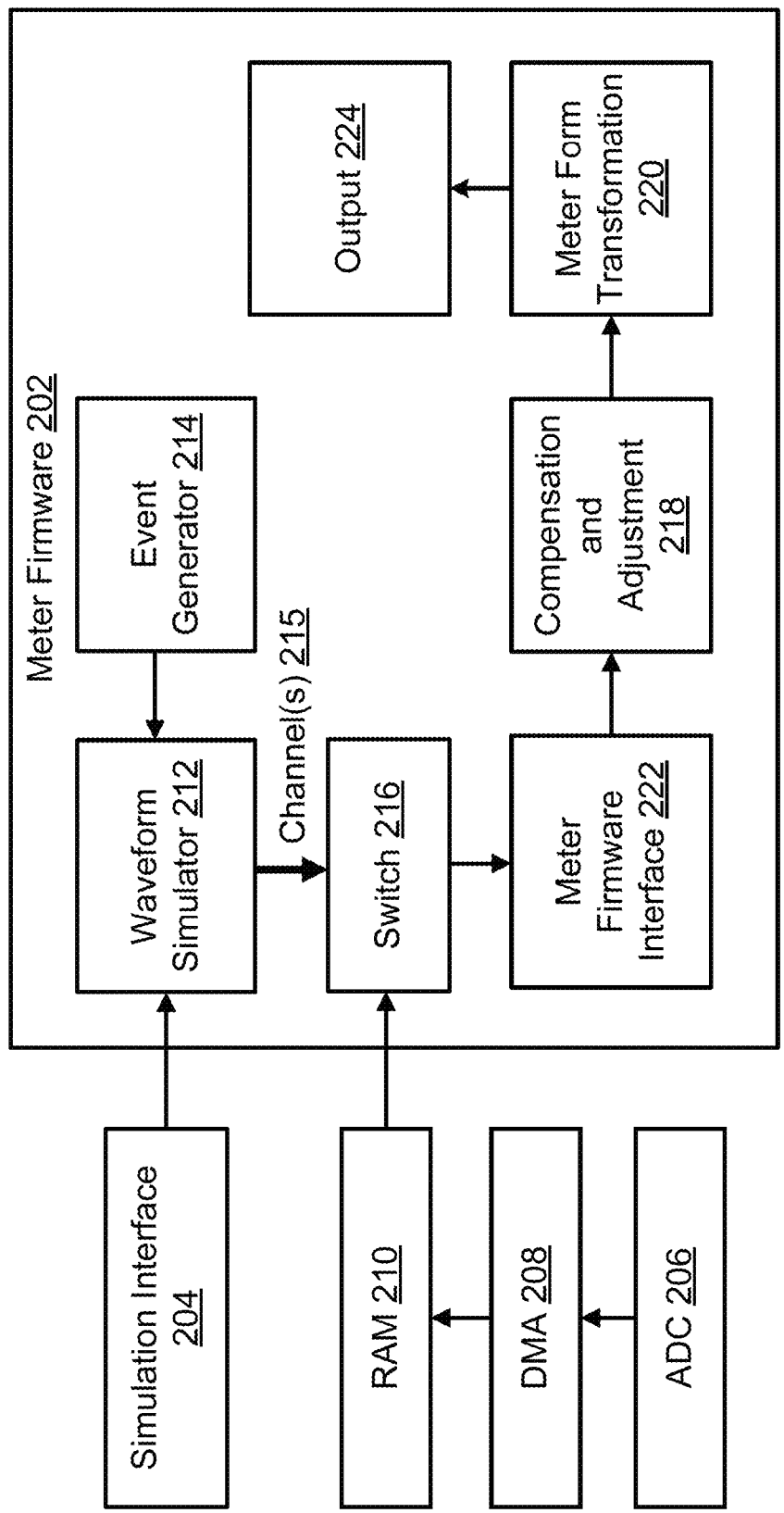
FIG. 2 is a block diagram illustrating a portion of a circuit board of an electric meter according to some implementations described herein.

In addition to a standard operating mode, the meter may also operate in a simulation mode where instead of using inputs provided by the measurement circuitry and the ADC, the meter uses simulated waveforms and simulated events. FIG. 2 is a block diagram illustrating a portion of the circuit board 106 of an electric meter 100 connected to an external simulation interface component 204, according to some implementations described herein. The circuit board 106 may include meter firmware 202 stored in a component on the circuit board, an ADC 206, a direct memory access (DMA) component 208, and random-access memory (RAM) 210. The meter firmware 202 includes a waveform simulator 212, an event generator 214, a switch 216, a compensation and adjustment block 218, a meter form transformation block 220, as well as other functions (not shown). The meter firmware interface 222 receives waveform data from either the output of the ADC or the output of the waveform simulator depending on the state of switch 216, which may be implemented in the firmware as a software switch. FIG. 2 depicts channel(s) 215. The waveform simulator 212 outputs one or more channels 215 and provides the one or more channels to the switch 216.

The compensation and adjustment block 218 provides scaling, conversion, and calibration. The meter form transformation block 220 converts the native voltage and current ADC inputs to a mathematical form appropriate for the specific meter form (e.g., 2S, 9S, 12S, etc.) being measured. The output 224 of the meter form transformation block 220 may be used by the meter firmware to perform other functions, including detecting the fundamental frequency of the waveforms and determining consumption and power measurement calculations.

When the meter 100 is operating in a normal operating mode, the ADC 206 may sample signals from the measurement circuitry at an ADC sampling rate to generate multiple channels of data. For example, in a 3-phase meter, the ADC 206 may sample the signals using a sampling frequency of 14.648 kHz and may provide six channels of data, namely phase A voltage, phase A current, phase B voltage, phase B current, phase C voltage, and phase C current signals. The DMA 208 may provide the sampled data to the meter firmware 202 via the RAM 210. In normal operating mode, the switch 216 is configured to provide the data from the ADC to the meter firmware interface 222.

When the meter 100 is operating in a simulation mode, switch 216 is configured to provide the simulated waveforms from the waveform simulator 212 to the meter firmware interface 222. One benefit of providing the simulated waveforms to the meter firmware interface is that it allows more accurate simulations. If simulated data is presented at a point downstream of the meter firmware interface, then portions of the firmware are bypassed during simulation.

Figure 3:
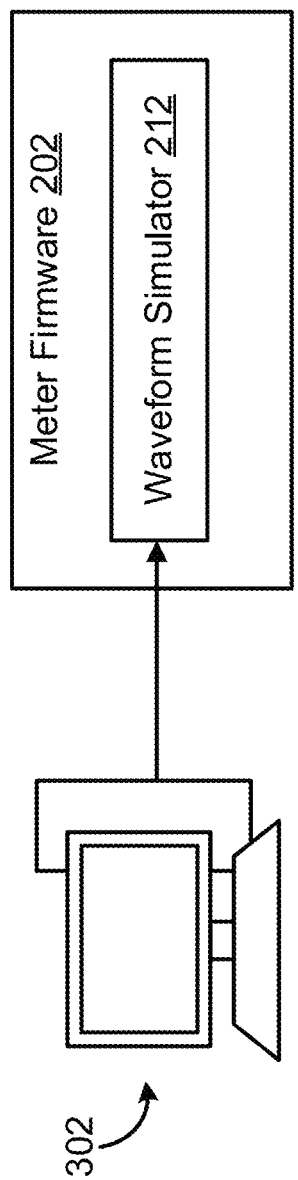
FIG. 3 is a block diagram of a computing device inputting data to a waveform simulator for generating simulated waveforms, according to some implementations described herein.

To enter simulation mode, the meter may need to be in a certain mode, e.g., factory mode, or in a certain condition, e.g., disassembled and connected to a simulation interface component. In one example, the meter 100 is partially disassembled and a simulation interface component 204 is connected to the circuit board 106. The simulation interface component 204 may be provided by an external computing device, such as the external computing device 302 depicted in FIG. 3, that is communicatively coupled to the circuit board. The computing device 302 may be a laptop, desktop, or any other computing device that is suitable for inputting parameters to the waveform simulator 212.

When the meter is disassembled a sensor may detect the removal of the meter housing 102 and/or the interior cover 104 and may cause the meter to enter a factory mode. There may be other or alternative requirements to enter simulation mode. In some implementations, a user may be required to enter an additional key, which may be obtained from the manufacturer of the meter, or set a value to a predetermined value.

The simulation interface component 204 may provide the waveform simulator with simulation component values, as well as enabling the meter 100 to operate in simulation mode. A user may enter the simulation component values via the simulation interface or may select a set of previously stored simulation component values. The simulation component values may include waveform component values, such as those shown in Table 1 depicted below. Different sets or tables of waveform component values may correspond to different meter forms. Table 1 shows example default values for a 9S meter form. Other tables may provide values for a 2S meter form or a 12S meter form, or a different set of default values for a 9S meter form.

TABLE 1

WAVEFORM COMPONENT VALUES

| | |
|---|---|
| METER LOAD SIMULATION ENABLE | 0 - Meter Load Simulation is disabled |
| LINE FREQUENCY | 60 Hz |
| RMS VOLTAGE A | 120 Volts |
| RMS VOLTAGE B | 120 Volts |
| RMS VOLTAGE C | 120 Volts |
| RMS CURRENT A | 2.5 Amps |
| RMS CURRENT B | 2.5 Amps |
| RMS CURRENT C | 2.5 Amps |
| PHASE A VOLTAGE ANGLE | 0 Degrees |
| PHASE B VOLTAGE ANGLE | 120 Degrees |
| PHASE C VOLTAGE ANGLE | −120 Degrees |
| PHASE A CURRENT ANGLE | 0 Degrees |
| PHASE B CURRENT ANGLE | 120 Degrees |
| PHASE C CURRENT ANGLE | −120 Degrees |
| DC OFFSET VOLTAGE A | 0.1 Volts |
| DC OFFSET VOLTAGE B | 0.2 Volts |
| DC OFFSET VOLTAGE C | 0.3 Volts |
| DC OFFSET CURRENT A | 0.01 Amps |
| DC OFFSET CURRENT B | 0.02 Amps |
| DC OFFSET CURRENT C | 0.03 Amps |
| Number of Harmonics Voltage A | 2 |
| Number of Harmonics Voltage B | 2 |
| Number of Harmonics Voltage C | 2 |
| Number of Harmonics Current A | 2 |
| Number of Harmonics Current B | 2 |
| Number of Harmonics Current C | 2 |
| Harmonic Number 1 for Voltage A | 1 |
| Harmonic Number 2 for Voltage A | 3 |
| Harmonic Number 1 for Voltage B | 1 |
| Harmonic Number 2 for Voltage B | 5 |
| Harmonic Number 1 for Voltage C | 1 |
| Harmonic Number 2 for Voltage C | 7 |
| Harmonic Number 1 for Current A | 1 |
| Harmonic Number 2 for Current A | 9 |
| Harmonic Number 1 for Current B | 1 |
| Harmonic Number 2 for Current B | 11 |
| Harmonic Number 1 for Current C | 1 |
| Harmonic Number 2 for Current C | 13 |
| HARMONIC MAGNITUDE 1 VOLTAGE A | 100% |
| HARMONIC MAGNITUDE 2 VOLTAGE A | 33% |
| HARMONIC MAGNITUDE 1 VOLTAGE B | 100% |
| HARMONIC MAGNITUDE 2 VOLTAGE B | 20% |
| HARMONIC MAGNITUDE 1 VOLTAGE C | 100% |
| HARMONIC MAGNITUDE 2 VOLTAGE C | 14% |
| HARMONIC MAGNITUDE 1 CURRENT A | 100% |
| HARMONIC MAGNITUDE 2 CURRENT A | 11% |
| HARMONIC MAGNITUDE 1 CURRENT B | 100% |
| HARMONIC MAGNITUDE 2 CURRENT B | 9% |
| HARMONIC MAGNITUDE 1 CURRENT C | 100% |
| HARMONIC MAGNITUDE 2 CURRENT C | 7% |
| HARMONIC PHASE 1 VOLTAGE A | 0 Degrees |
| HARMONIC PHASE 2 VOLTAGE A | 2 Degrees |
| HARMONIC PHASE 1 VOLTAGE B | 0 Degrees |
| HARMONIC PHASE 2 VOLTAGE B | 4 Degrees |
| HARMONIC PHASE 1 VOLTAGE C | 0 Degrees |
| HARMONIC PHASE 2 VOLTAGE C | −2 Degrees |
| HARMONIC PHASE 1 CURRENT A | 0 Degrees |
| HARMONIC PHASE 2 CURRENT A | 3 Degrees |
| HARMONIC PHASE 1 CURRENT B | 0 Degrees |
| HARMONIC PHASE 2 CURRENT B | 6 Degrees |
| HARMONIC PHASE 1 CURRENT C | 0 Degrees |
| HARMONIC PHASE 2 CURRENT C | −3 Degrees |

The waveform component values in Table 1 can include voltage or current values for each channel (such as RMS Voltage A or RMS Current A), frequency values (such as Line Frequency), phase values for each channel (such as phase A voltage angle or phase A current angle), and harmonic values for each channel and harmonic (such as Harmonic Magnitude and Harmonic Phase). The waveform component values enable the simulation of waveforms with multiple harmonics, where each harmonic is identified by a harmonic number and each harmonic is associated with a harmonic magnitude and harmonic phase. In Table 1, multiple harmonics for a single channel may be specified by providing harmonic magnitude and harmonic phase values for each harmonic number and associating the values with a channel number. The waveform simulator 212 may generate the simulated waveforms based on the waveform component values. The number of channels is based on the meter form being simulated. For a three-phase meter, there may be six channels, phase A voltage, phase A current, phase B voltage, phase B current, phase C voltage, and phase C current, and each channel may include harmonics.

In addition to the waveform component values, the simulation component values may also include event component values for simulating events. Exemplary events may include sag, swell, flicker, transients, service interruption, and power quality events. A user may configure the magnitude and duration of each event. The events may be queued such that multiple events can be defined and executed for any channel. The event component values may be inputted in the form of a table, such as in Table 2 depicted below.

TABLE 2

EVENT COMPONENT VALUES

| | |
|---|---|
| EVENT GENERATION FLAG | 0 - Disable Event Generation |
| EVENT GENERATION START | 0 - Stop Event Generation |
| EVENT POINTER | 0 |
| NUMBER OF EVENTS | 2 |
| HALF CYCLE COUNTER | 0 |
| EVENT DURATION IN HALF LINE CYCLES 1 | 120 |
| PERCENT CHANGE 1 VOLTAGE A | 100 |
| PERCENT CHANGE 1 VOLTAGE B | 30 |
| PERCENT CHANGE 1 VOLTAGE C | 100 |
| PERCENT CHANGE 1 CURRENT A | 100 |
| PERCENT CHANGE 1 CURRENT B | 100 |
| PERCENT CHANGE 1 CURRENT C | 100 |
| EVENT DURATION IN HALF LINE CYCLES 2 | 240 |
| PERCENT CHANGE 2 VOLTAGE A | 100 |
| PERCENT CHANGE 2 VOLTAGE B | 100 |
| PERCENT CHANGE 2 VOLTAGE C | 100 |
| PERCENT CHANGE 2 CURRENT A | 20 |
| PERCENT CHANGE 2 CURRENT B | 100 |
| PERCENT CHANGE 2 CURRENT C | 100 |

The event table can include multiple events. For example, Table 2 depicts component values for two events. The magnitude of an event may be specified as a percentage, such as a percent change for voltage A or a percent change for current A. The duration of an event may be specified as a number of half line cycles. Each event may be defined by a set of values specifying a magnitude and a duration of the event. The Event Pointer component value specifies which event number to start on. For example, a value of 0 may specify starting on event 1 and a value of 1 may specify starting on event 2. The event generator 214 may generate one or more events in parallel with the waveform simulator 212 generating the simulated waveform data. The event generator 214 may transmit the events to the waveform simulator 212.

The method for generating simulated waveform data includes generating simulated sine waves for each harmonic specified for a channel and then summing the sine waves for the harmonics for that channel to generate a simulated channel waveform. The sine waves may be generated using the waveform component values such as the harmonic number magnitudes and the harmonic number phases. Once all the harmonics for all the channels are processed, the simulated channel waveforms are provided to the meter firmware interface.

Figure 4:
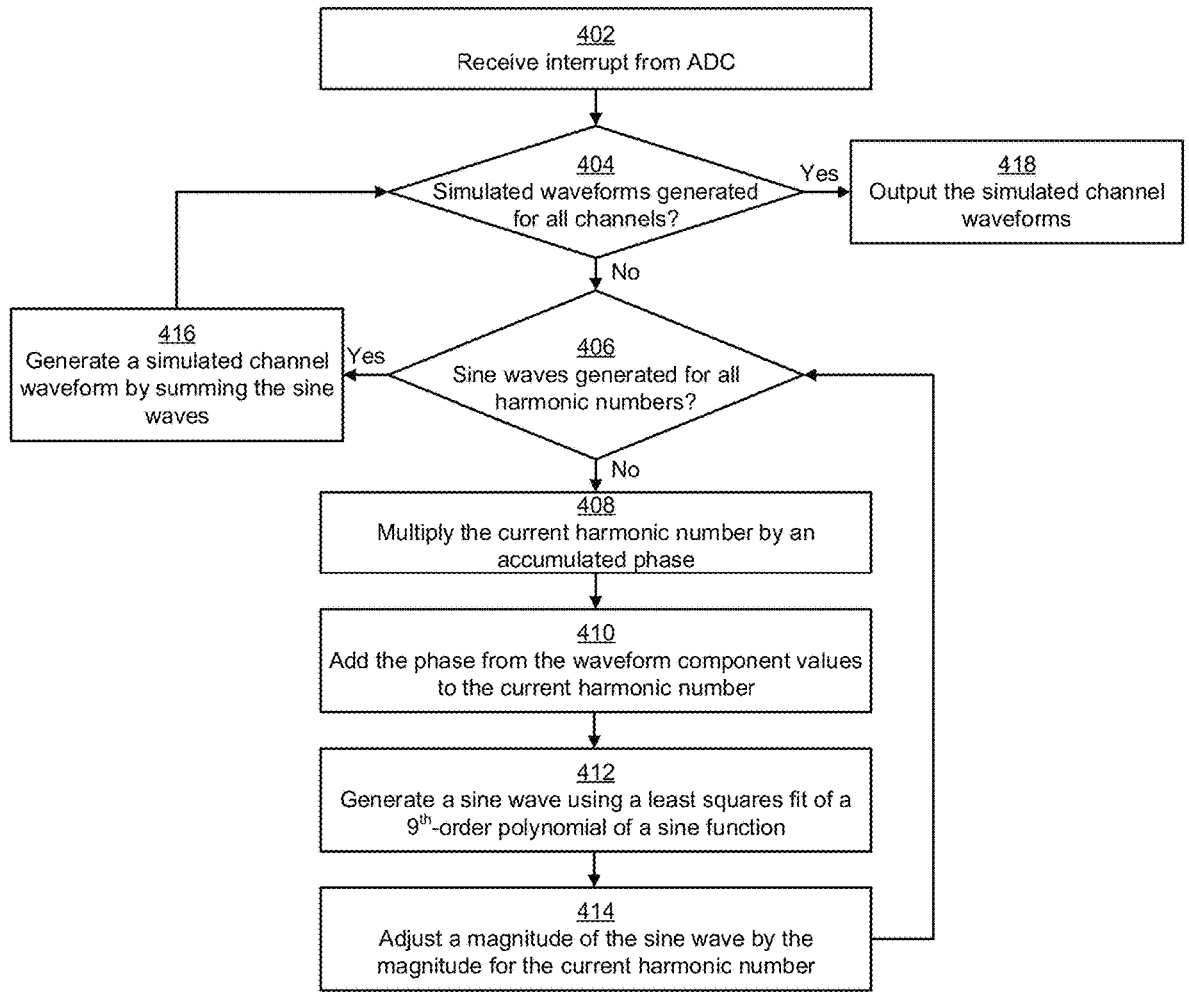
FIG. 4 is a flowchart of a process of generating simulated waveforms, according to some implementations described herein.

FIG. 4 is a flowchart of a process of generating simulated waveforms, according to some implementations described herein. FIG. 4 is discussed with respect to the components of the meter 100 depicted in FIGS. 1-2, but is not limited to the illustrated components. At block 402, the meter firmware 202 may receive an interrupt from the ADC 206 via the DMA 208. The rate of the interrupt corresponds to the sample rate of the ADC. The rate of the interrupt in simulation mode is the same as the rate in operating mode. The interrupt triggers the generation of a new waveform sample for each channel. The waveform simulator 212 uses the waveform component values downloaded from the simulation interface component 204 to generate waveforms for each channel. The waveform component values for each channel may include a voltage or a current value, a frequency value, a phase value, and optionally a harmonic magnitude value, and a harmonic phase. The waveform simulator determines a maximum number of channels and a maximum number of harmonics for each channel based on the waveform component values. In some examples, a value for the maximum number of channels and values for the maximum number of harmonics for each channel may be part of the downloaded values. In other examples, rather than downloading the maximum number of channels or the maximum number of harmonics, the meter firmware 202 may determine the maximum number of channels or the maximum number of harmonics based on the valid waveform component values. For example, if a waveform component value of zero is an invalid value, then any waveform components with a value of zero are not included in the simulation. If the values for RMS Voltage B and RMS Voltage C are zero, then the simulation is for a single-phase meter and the maximum number of channels is two, Phase A voltage and Phase A current.

At block 404, the waveform simulator 212 determines if a simulated channel waveform has been generated for all channels by comparing a channel count or the current channel number to the maximum number of channels. If the current channel number is less than the maximum number of channels, the process continues to block 406. At block 406, the waveform simulator 212 determines if all sine waves for the current channel have been generated for all harmonics for the current channel by comparing a current count of the harmonics generated for the current channel with a maximum number of harmonics for the current channel. If the current harmonic count is less than the maximum number of harmonics, the process continues to block 408.

At block 408, the waveform simulator 212 generates harmonics for the current channel by multiplying the current harmonic number by an accumulated phase. The phase for the initial sample is specified by the waveform component values and the phase for subsequent samples is increased by $2\pi (F_L/F_S)$. The fundamental cumulative phase is represented by:

$$P_{n+1} = P_n + 2\pi(F_L/F_S)$$

where $P_n$ is the phase of the previously generated sample, $F_L$ is the line frequency, and $F_S$ is the sampling frequency of the ADC.

The kth harmonic cumulative phase is represented by:

$$k\,P_{n+1} = k(P_n + 2\pi(F_L/F_S))$$

where k=1, 2, . . . (up to the number of harmonics to generate).

At block 410, the waveform simulator 212 adds the harmonic phase value ($P_{harm}$) for the current harmonic number. At block 412, the waveform simulator 212 generates a sine wave using a least squares fit of a $9^{th}$-order polynomial of a sine function. Since a sine function is an odd function only the odd coefficients of the polynomial are non-zero. Thus, the calculation only requires 5 non-zero coefficients. The sine wave is generated over an interval of [-pi, pi]. The sine wave may be represented as $\sin(kP_n + P_{harm})$, where k is the current harmonic number.

At block 414, the waveform simulator 212 adjusts a magnitude of the sine wave by the harmonic magnitude of the current harmonic number to generate a sine wave with harmonics. At this point, the harmonic count is adjusted to indicate that processing for the current harmonic number is complete. The process continues to block 406. Once sine waves have been generated for all harmonic numbers for the current channel, the process continues to block 416. At block 416, the waveform simulator 212 generates a simulated channel waveform for the current channel by summing the generated sine waves for all of the harmonics for the current channel. At this point the channel count is adjusted to indicate that processing for the current channel is complete. The process then continues to block 404. If all channel waveforms have not been generated, then the process is repeated to generate an additional channel waveform. Once all simulated channel waveforms have been generated, the process continues to block 418. At block 418, the waveform simulator 212 outputs the simulated channel waveforms to the meter firmware interface 222.

In some examples, the waveform simulator 212 may modify the simulated channel waveforms using events, such as sag or swell events, generated by the event generator 214 before outputting the simulated channel waveform to the meter firmware interface 222. The method for generating events for a channel includes generating events based on event component values downloaded from the waveform simulator 212.

Figure 5:
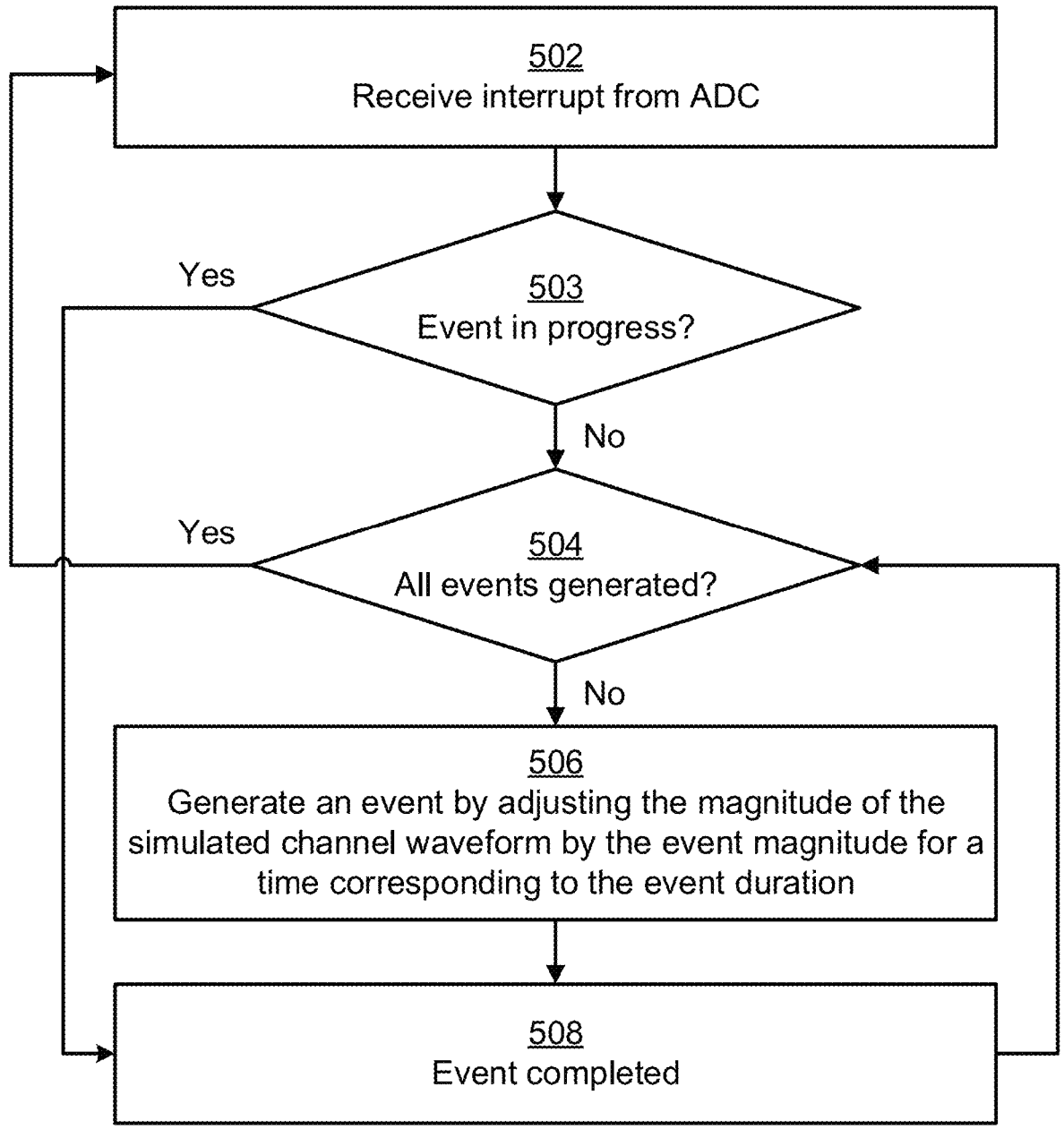
FIG. 5 is a flowchart of a process of generating events for simulated waveforms, according to some implementations described herein.

FIG. 5 is a flowchart of a process of generating events for a channel, according to some implementations described herein. FIG. 5 is discussed with respect to the components of the meter 100 depicted in FIGS. 1-2, but other components may be used. At block 502, the event generator 214 may receive the interrupt from the ADC 206 via the DMA 208. The interrupt is the same as the interrupt received by the waveform simulator 212 in FIG. 4. The event generator 214 uses event component values downloaded from a simulation interface component 204. The event component values may include event magnitudes, event durations, and a maximum number of events for the current channel. In some examples, instead of receiving the maximum number of events, the event generator 214 may determine the maximum number of events by counting the number of valid event magnitudes or event durations downloaded from the simulation interface component 204.

At block 503, the event generator determines whether an event is in progress. If an event is in progress, then then the process proceeds to block 508. If an event is not in progress, then the process proceeds to block 504. At block 504, the event generator 214 determines if all events for the channel have been generated by comparing a current event number to the maximum number of events. If the current event number is less than the maximum number of events, the process continues to block 506.

At block 506, the event generator 214 generates an event by generating an adjustment of the magnitude of the simulated waveform for the current channel for a time corresponding to the event duration. The event generator 214 may output the event to the waveform simulator 212. In some examples, the waveform simulator 212 may use the event to adjust the magnitude of the simulated channel waveform at block 418 in FIG. 4 before outputting the simulated channel waveform to the meter firmware interface 222. The process may continue to block 508. The process remains at block 508 until the event is completed. Once the event is completed, the current event number is incremented and the process proceeds to block 504. Once all events for the current channel have been completed, the process may return to block 502 to wait for the next interrupt.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "configured to" herein is meant as open and inclusive language that does not foreclose devices configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for generating simulated waveforms by an electric meter, comprising:
    operating in a simulation mode, wherein while operating in the simulation mode, simulated waveforms are used instead of data from an analog to digital converter (ADC) within the electric meter;
    generating the simulated waveforms for a plurality of channels using a plurality of waveform component values by:
    for each channel of the plurality of channels:
        accessing a set of waveform component values for the channel, wherein the waveform component values for the channel include at least a voltage or a current value, a frequency value, and a phase value; and
        generating a simulated channel waveform using the set of waveform component values for the channel at a rate that corresponds to a sample rate of the ADC, wherein the sample rate of the ADC in the simulation mode matches a sample rate of the ADC in an operating mode; and
    providing the simulated channel waveforms for the channels to a meter firmware interface, wherein the meter firmware interface receives waveform data obtained from the ADC during the operating mode.

2. The method of claim 1, wherein generating a simulated channel waveform comprises:
    generating a sine wave using a least squares fit of a $9^{th}$-order polynomial of a sine function over an interval.

3. The method of claim 2, wherein the simulated channel waveform includes a plurality of samples, further comprising increasing a phase for a sample over a phase for a previous sample.

4. The method of claim 1, wherein the waveform component values include a plurality of harmonic numbers, a magnitude for each of the harmonic numbers, and a phase for each of the harmonic numbers, and wherein generating a simulated channel waveform comprises:
    for each harmonic number:
        multiplying the harmonic number by an accumulated phase;
        adding the phase for the harmonic number;
        generating a sine wave using a least squares fit of a $9^{th}$-order polynomial of a sine function; and
        adjusting a magnitude of the sine wave by the magnitude for the harmonic number to generate a sine wave with harmonics; and
    summing the sine waves with harmonics for the harmonic numbers.

5. The method of claim 1, further comprising:
    for at least a selected one of the channels:
        accessing a set of event component values for the selected channel; and
        generating an event for the selected channel, wherein the event has an event magnitude and an event duration, and a magnitude of the simulated channel waveform for the selected channel is adjusted by the event magnitude for a time corresponding to the event duration.

6. The method of claim 1, further comprising:
    determining that a housing of the electric meter is removed from a base of the electric meter; and
    in response to determining that a housing of the electric meter is removed, operating in the simulation mode.

7. The method of claim 1, wherein the method further comprises:
accessing a second plurality of waveform component values for a second plurality of channels;
generating a second set of simulated channel waveforms; and
providing the second set of simulated channel waveforms to the meter firmware interface.

8. The method of claim 1, wherein accessing the plurality of waveform component values comprises receiving the waveform component values from a simulation interface component connected to the electric meter.

9. The method of claim 1, wherein the plurality of channels include at least one voltage channel and at least one current channel.

10. A meter comprising:
an ADC that operates at a sampling rate during an operating mode; and
meter firmware comprising:
a waveform simulator configured to generate waveforms for a plurality of channels using a plurality of waveform component values when the meter is in a simulation mode by:
for each channel of the plurality of channels:
accessing a set of waveform component values for the channel, wherein the waveform component values for the channel comprise at least a voltage value or a current value, a frequency value, and a phase value; and
generating a simulated channel waveform using the set of waveform component values for the channel at a rate that corresponds to a sample rate of the ADC, wherein the sample rate of the ADC in the simulation mode matches a sample rate of the ADC in an operating mode;
an event simulator configured to generate an event for at least one channel, wherein the event includes a magnitude and a duration; and
a meter firmware interface configured to receive the simulated channel waveforms from the waveform simulator when the meter operates in the simulation mode and to receive waveform data obtained from the ADC during the operating mode.

11. The meter of claim 10, wherein the waveform simulator is configured to generate a simulated waveform channel by generating a sine wave using a least squares fit of a $9^{th}$-order polynomial of a sine function over an interval.

12. The meter of claim 10, wherein the meter is configured to connect to an external simulation interface component and to receive the plurality of waveform component values from the external simulation interface component.

13. The meter of claim 12, wherein the waveform simulator is configured to:
receive, from the external simulation interface component, a second plurality of waveform component values for a second plurality of channels;
generate a second set of simulated channel waveforms; and
provide the second set of simulated channel waveforms to the meter firmware interface.

14. The meter of claim 10, wherein the waveform component values comprise a plurality of harmonic numbers, a magnitude for each of the harmonic numbers, and a phase for each of the harmonics numbers, and wherein the waveform simulator is configured to generate a simulated channel waveform by:
for each harmonic number:
multiplying the harmonic number by an accumulated phase;
adding the phase for the harmonic number;
generating a sine wave using a least squares fit of a $9^{th}$-order polynomial of a sine function; and
adjusting a magnitude of the sine wave by the magnitude for the harmonic number to generate a sine wave with harmonics; and
summing the sine waves with harmonics for the harmonic numbers.

15. The meter of claim 10, wherein the meter firmware is configured to provide the simulated channel waveforms from the waveform simulator when the meter is operating in simulation mode and to provide waveform data obtained from the ADC when the meter is operating in the operating mode.

16. The meter of claim 10, wherein the plurality of channels comprises at least one voltage channel and at least one current channel.

17. A system comprising:
a simulation interface component configured to transmit a plurality of waveform component values to a meter; and
the meter capable of operating in an operating mode or a simulation mode, wherein while operating in the operating mode, an ADC operates at a sampling rate and provides data to a meter firmware interface, wherein while operating in the simulation mode, the meter is configured to generate simulated waveforms for a plurality of channels by:
for each channel of the plurality of channels:
receiving, from the simulation interface component, a set of waveform component values for the channel, wherein the waveform component values for the channel comprise at least a voltage or a current value, a frequency value, and a phase value; and
generating a simulated channel waveform using the set of waveform component values for the channel at a rate that corresponds to a sample rate of the ADC, wherein the sample rate of the ADC in the simulation mode matches the sampling rate of the ADC in the operating mode; and
providing the simulated channel waveforms for the channels to the meter firmware interface.

18. The system of claim 17, wherein the meter is configured to generate a simulated channel waveform by generating a sine wave using a least squares fit of a $9^{th}$-order polynomial of a sine function over an interval.

19. The system of claim 17, wherein the meter is configured to:
receive, from the simulation interface component, a second plurality of waveform component values for a second plurality of channels;
generate a second set of simulated channel waveforms; and
provide the second set of simulated channel waveforms to the meter firmware interface.

20. The system of claim 17, wherein the plurality of channels includes at least one voltage channel and at least one current channel.

* * * * *